(12) United States Patent
Mavencamp et al.

(10) Patent No.: US 8,174,248 B2
(45) Date of Patent: May 8, 2012

(54) SYSTEMS AND METHODS OF BIT STUFFING PULSE WIDTH MODULATION

(75) Inventors: Daniel Mavencamp, Dallas, TX (US); Dal Yihong, Plano, TX (US); Abdelhalim Alsharqawi, Richardson, TX (US); Steve Martindell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 433 days.

(21) Appl. No.: 12/467,265

(22) Filed: May 16, 2009

(65) Prior Publication Data

US 2010/0289560 A1 Nov. 18, 2010

(51) Int. Cl.
  *G05F 1/613* (2006.01)
  *G05F 1/40* (2006.01)
(52) U.S. Cl. ........................................ 323/225; 323/271
(58) Field of Classification Search .................. 323/223, 323/225, 268, 271, 282, 288
See application file for complete search history.

(56) References Cited

U.S. PATENT DOCUMENTS

| | | | | |
|---|---|---|---|---|
| 4,707,625 A | * | 11/1987 | Yanagisawa | 327/437 |
| 7,046,040 B2 | * | 5/2006 | Guedon | 326/88 |
| 7,514,908 B2 | * | 4/2009 | Hosokawa et al. | 323/222 |
| 7,609,036 B2 | * | 10/2009 | Bartolo et al. | 323/224 |
| 8,013,642 B2 | * | 9/2011 | Nakagawa | 327/108 |

* cited by examiner

*Primary Examiner* — Matthew Nguyen
(74) *Attorney, Agent, or Firm* — William B. Kempler; Wade J. Brady, III; Frederick J. Telecky, Jr.

(57) ABSTRACT

Systems and methods for bit stuffing pulse width modulation are provided. Example embodiments of the systems and methods of bit stuffing pulse width modulation disclosed herein may allow for a significant reduction in the size of the bootstrap capacitor while giving up only a small percentage of output drive, and reduce die space. Included in such systems and methods is the ability to digitally detect inactivity on the PMW signals for a class D power amplifier, and to digitally insert small charge pulses at a fairly low repetition rate relative to the normal switching frequency. The low repetition rate may preserve the maximum output power while still allowing enough charge to transfer to the bootstrap capacitor.

19 Claims, 5 Drawing Sheets

SYSTEMS AND METHODS OF BIT STUFFING PULSE WIDTH MODULATION

TECHNICAL FIELD

The present disclosure is generally related to electronics and, more particularly, is related to switched mode power supplies.

BACKGROUND

A switched-mode power supply (also switching-mode power supply and SMPS) is an electronic power supply unit (PSU) that incorporates a switching regulator. While a linear regulator maintains the desired output voltage by dissipating excess power in a pass power transistor, the SMPS rapidly switches a power transistor between saturation (full on) and cutoff (completely off) with a variable duty cycle whose average is the desired output voltage. The resulting rectangular waveform is low-pass filtered with an inductor and capacitor. The main advantage of this method is greater efficiency because the switching transistor dissipates little power in the saturated state and the off state compared to the semiconducting state (active region). Other advantages include smaller size and lighter weight (from the elimination of low frequency transformers which have a high weight) and lower heat generation due to higher efficiency. Disadvantages include greater complexity, the generation of high amplitude, high frequency energy that the low-pass filter must block to avoid electromagnetic interference (EMI), and a ripple voltage at the switching frequency and the harmonic frequencies thereof.

SUMMARY

Example embodiments of the present disclosure provide systems and methods of bit stuffing pulse width modulation. Briefly described, in architecture, one example embodiment of the system, among others, can be implemented as follows: a pulse width modulator (PWM) driver configured to drive an H-bridge switch; and a pulse generator configured to generate a pulse, the pulse injected into an output of the H-bridge switch at a minimum duty cycle Embodiments of the present disclosure can also be viewed as providing methods for bit stuffing pulse width modulation. In this regard, one embodiment of such a method, among others, can be broadly summarized by the following: driving an H-bridge switch; determining whether the H-bridge switch switches states within a predetermined time period; and if the H-bridge switch fails to switch, injecting a pulse pattern into an output of the H-bridge switch

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

A half bridge is an electronic circuit SMPS which enables a voltage to be applied across a load in either direction. These circuits are often used in robotics and other applications to allow DC motors to run forwards and backwards. Half bridges are available as integrated circuits, or can be built from discrete components. A full bridge (or H-bridge) employs two half bridges back to back such that the full input voltage may achieve twice the output power of the half bridge. The term "H-bridge" is derived from the typical graphical representation of such a circuit.

Figure 1:
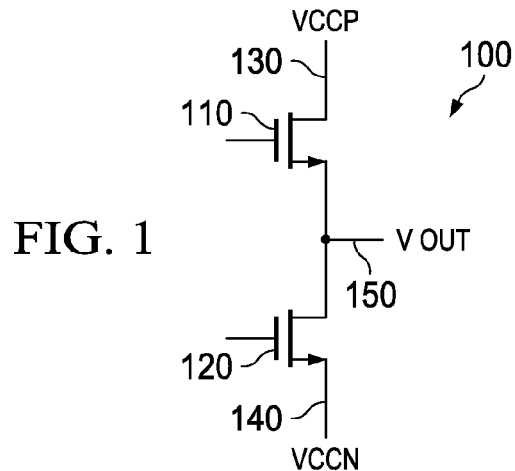
FIG. 1 is a circuit diagram of an example embodiment of an h-bridge circuit.

Referring to FIG. 1, A half bridge may be built with two switches (solid-state or mechanical). When the switch 110 is closed and switch 120 is open, a positive voltage will be applied across the motor. By opening switch 110 and closing switch 120, this voltage is reversed, allowing reverse operation of a motor. Switch 110 is often called a high side switch, and switch 120 is often called a low side switch.

The switches should not both be on at the same time. If both switches of a half bridge are turned on it creates a short circuit between the battery plus and battery minus terminals. This phenomenon is called shoot through in SMPS literature. If the bridge is sufficiently powerful it will absorb that load and the batteries will simply drain quickly. It is possible, however, for the switches in question melt.

When switch 110 is closed (ON) and switch 120 is open (OFF), the current flows from positive voltage 130 to output voltage 150 and the motor begins to turn in a "positive" direction. When switch 120 is closed (ON) and switch 110 is open (OFF), current flows from the other direction, from output voltage 150 to negative voltage 140, through the motor and the motor turns in the opposite direction.

If either of the drivers in the half bridge circuit achieve 100% duty cycle, as referred to previously, catastrophic failure may occur. A combination of bootstrap and charge-pumping techniques may be used to power the circuitry which drives the upper halves of the H-Bridge. The bootstrap technique supplies the high instantaneous current needed for turning on the power devices, while the charge pump provides enough current to "maintain" bias voltage on the upper driver sections and MOSFETs. Voltages on the upper bias supply pin "float" along with the source terminals of the upper power switches.

With bootstrap technology there is a major challenge between getting the bootstrap capacitor charged on the first pump so the output stage can perform correctly, and keeping that charge on the capacitor long enough to sustain low frequency outputs at 20 Hz, for example. Typical solutions in the past include allowing large inrush currents on the first cycle which requires a large diode, or the use of charge pump technology which requires more high voltage devices. In some cases the problem has been solved by limiting the maximum output drive power which reduces output power by 5 to 10%.

Example embodiments of the systems and methods of bit stuffing pulse width modulation disclosed herein may allow for a significant reduction in the size of the bootstrap capacitor while giving up only a small percentage of output drive, and reduce die space. Included in such systems and methods is the ability to digitally detect inactivity on the PMW signals for a class D power amplifier, and to digitally insert small charge pulses at a fairly low repetition rate relative to the normal switching frequency. The low repetition rate may preserve the maximum output power while still allowing enough charge to transfer to the bootstrap capacitor.

Figure 2:
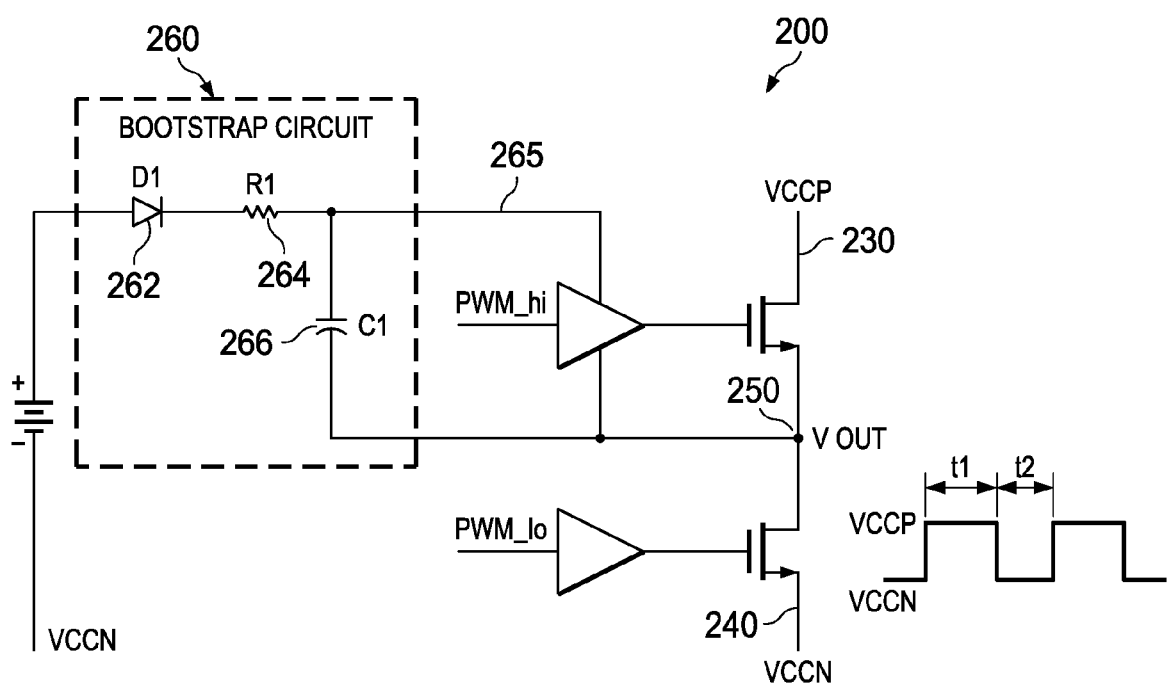
FIG. 2 is a circuit diagram of an example embodiment of a bootstrap circuit for driving the h-bridge circuit of FIG. 1.
Figure 3:
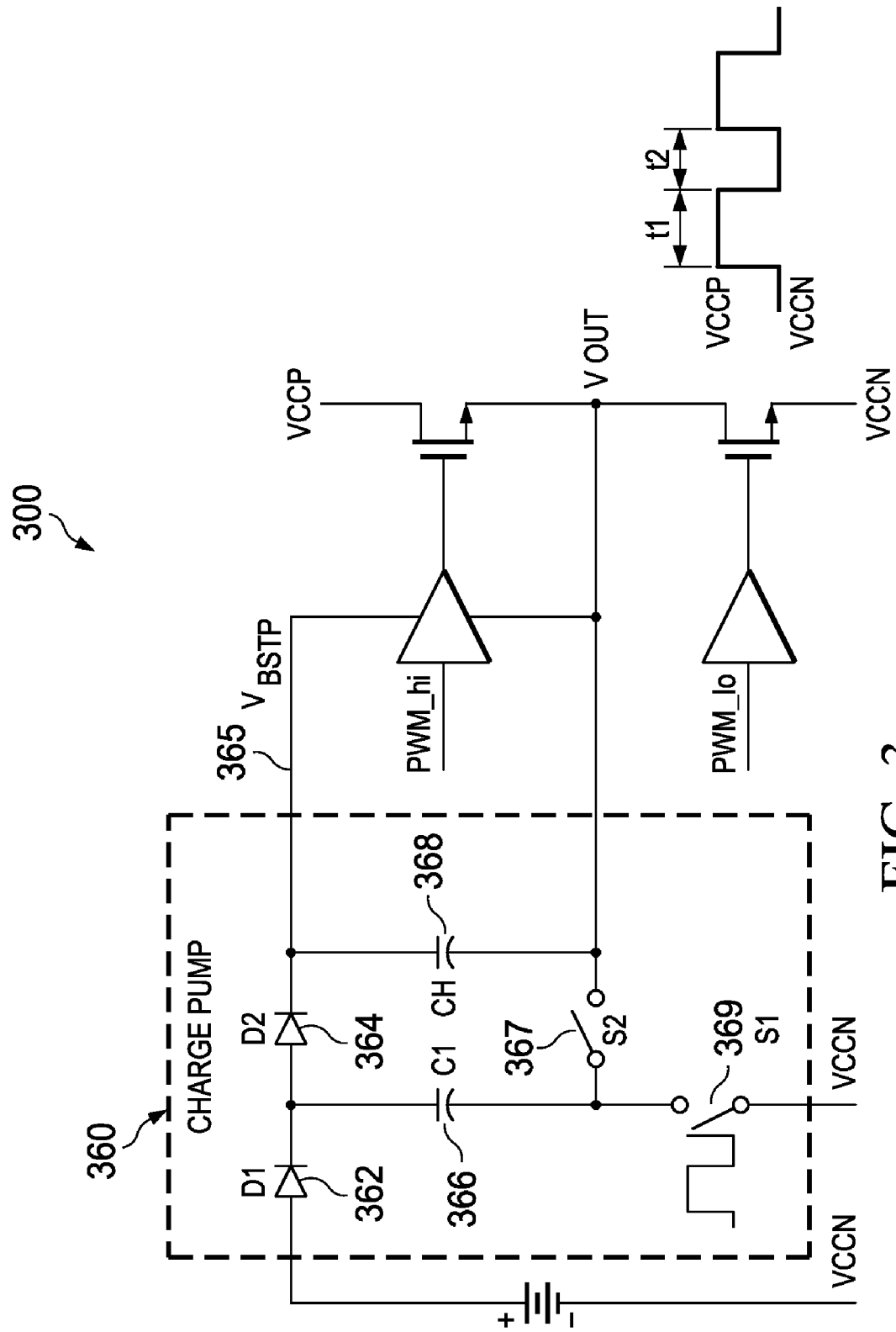
FIG. 3 is a circuit diagram of an example embodiment of a bit stuffing circuit for maintaining the bootstrap voltage in the circuit of FIG. 2.

Most H-bridge switches are implemented with n-channel metal oxide semiconductor (NMOS) devices to take advantage of their high mobility characteristics. The gate of the NMOS device then needs voltage higher than the rail voltage (VCCP) to turn it on. Usually a boot strap circuit is used to generate this voltage above the rail voltage as provided in half bridge circuit 200 in FIG. 2.

When VOUT 250 is switched to negative rail VCCN 240, the bootstrap circuit 260, comprising diode 262, resistor 264, and capacitor 266, will charge capacitor 266 to generate bootstrap voltage 265. When VOUT 250 is switched to positive rail VCCP 230, capacitor 266 has to be sufficiently large to maintain bootstrap voltage 265. If bootstrap voltage 265 is maintained, the H-bridge can be driven to 100% duty cycle to maintain maximum power.

For audio applications, capacitor 266 (C1) should be large enough for signals ranging from 20 Hz to 20 kHz. For example, assume a design has a 1V tolerance of drop for bootstrap voltage 265.

$$I \cdot \Delta t = C_1 \cdot \Delta V$$

For a 20 Hz signal, $\Delta t = 25$ mS. Assuming an example load current of 500 uA, $$C_1 = I \cdot \Delta t / \Delta V = 500\ uA \cdot 25\ mS/1V = 12.5\ uF$$

This is a large capacitor, which takes space on the board and adds cost to the system.

Figure 4:
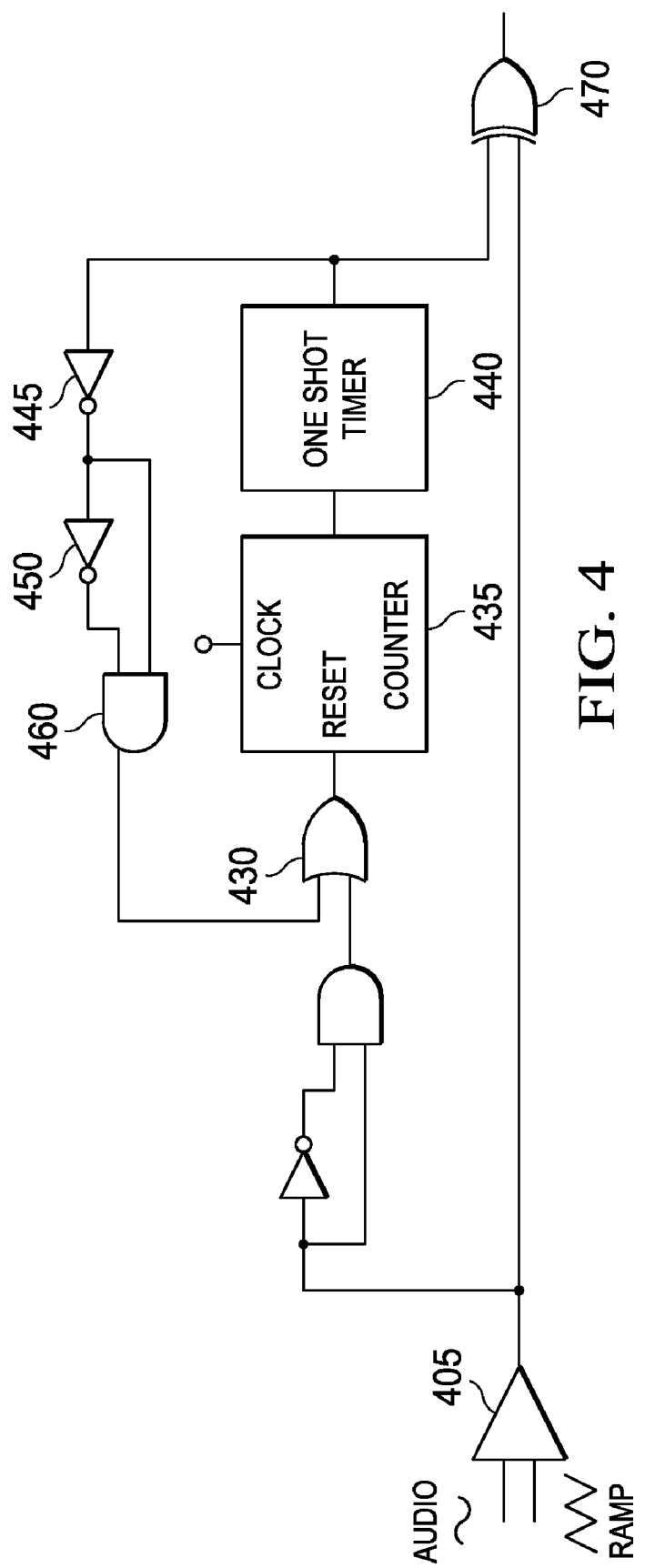
FIG. 4 is a signal diagram of an example embodiment of bit stuffing signal generated using the circuit diagram of FIG. 4.

In the disclosed systems and methods of bit stuffing PWM, a narrow pulse is inserted when PWM is 100% duty cycle as provided in the example embodiment of FIG. 4. A duty cycle loss of less than 1% may be sufficient to charge the boot strap cap and maintain the boot strap voltage. The boot strap capacitor may consequently be lowered to 20 nF, for example.

Comparator 405 may be part of a basic class D power amplifier in an audio application, for example. In an example embodiment, to accomplish bit stuffing, the output of comparator 405 is examined to determine if there are any rising edges. If there are any rising within a predetermined period, for example, 30 μsec, counter 435 is reset and nothing is added to the PWM stream at XOR gate 470. If however there are no edges at the output of comparator 405 within the predetermined period, then counter 435 times out and signals to one shot timer 440 to generate a pulse. The falling edge of the one shot timer 440 resets counter 435 to start the process over again.

Additionally, the output of one shot timer 440 is added back into the PWM stream through inverter 445, inverter 450, AND gate 460 and OR gate 430, causing a rising edge if one is needed. Falling edges may be generated as well to keep symmetry in the output waveform to prevent creation of a DC offset during a clipping condition.

The separation between pulses may be set by counter 435, and the width of the pulses may be set by one shot timer 440. Parameters for counter 435 and one shot timer 440 determine discharge and re-charge times for the boot strap capacitor. Having these values set at known quantities drives a level of predictability into the component selection for the bootstrap capacitor, and the on resistance and surge currents for the series diode that charges the boot strap capacitor.

Figure 5:
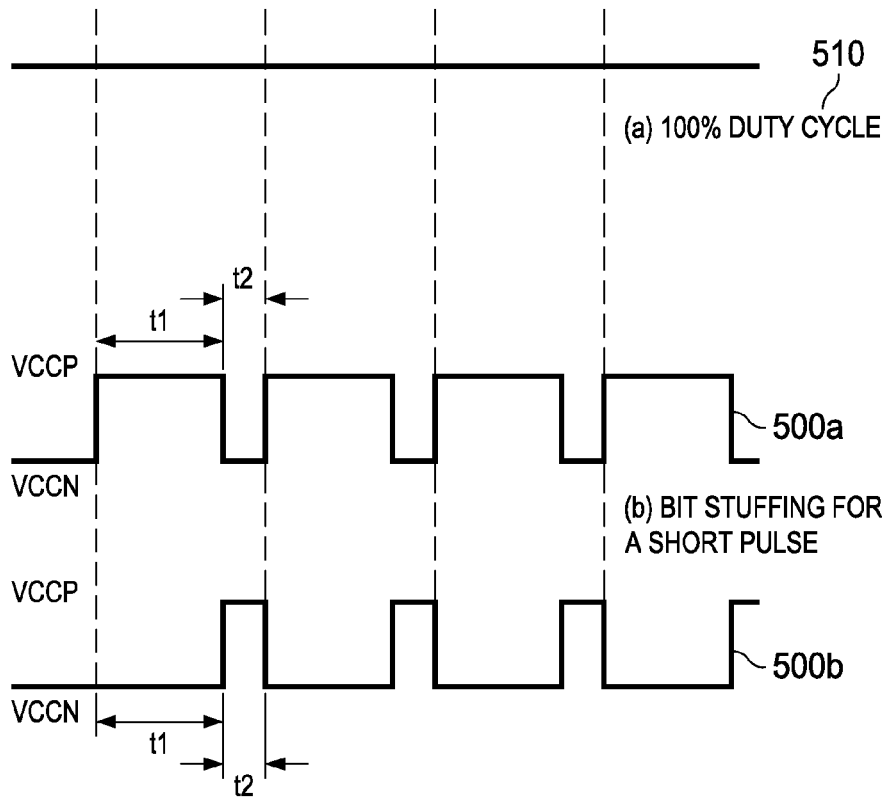
FIG. 5 is and signal diagram of an example embodiment of bit stuffing signals.

FIG. 5 provides bit stuffing signals 500a and 500b, one of which may be inserted when output voltage 510 is at 100% duty cycle. Bit stuffing signal 500a is a negative bit stuffing pulse and bit stuffing signal 500b is a positive bit stuffing pulse. The polarity of the bit stuffing signal used in not important. If the output duty cycle hits 100% or 0%, the opposite polarity bit stuffing signal can be used to recharge bootstrap capacitor 266. When the bit stuffing pulse 500a, 500b is inserted at the output voltage, a duty cycle loss of less than 1% is usually sufficient to charge the boot strap cap and maintain the bootstrap voltage. In an example embodiment, t2 is chosen to be much smaller than t1. Additionally, the bootstrap capacitor may be significantly decreased in value and size.

Figure 6A:
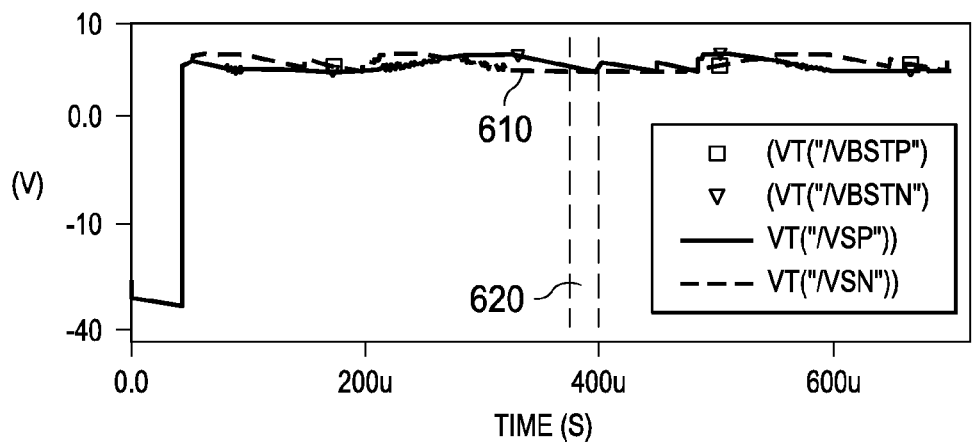
FIG. 6A is a signal diagram of a bootstrap output voltage of the circuit of FIG. 4.
Figure 6B:
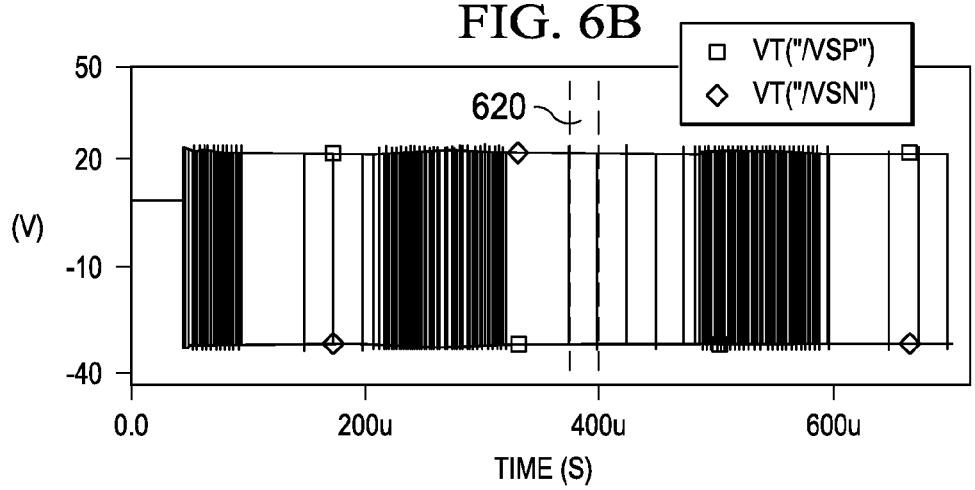
FIG. 6B is a signal diagram of a driver voltage of the circuit of FIG. 3.
Figure 6C:
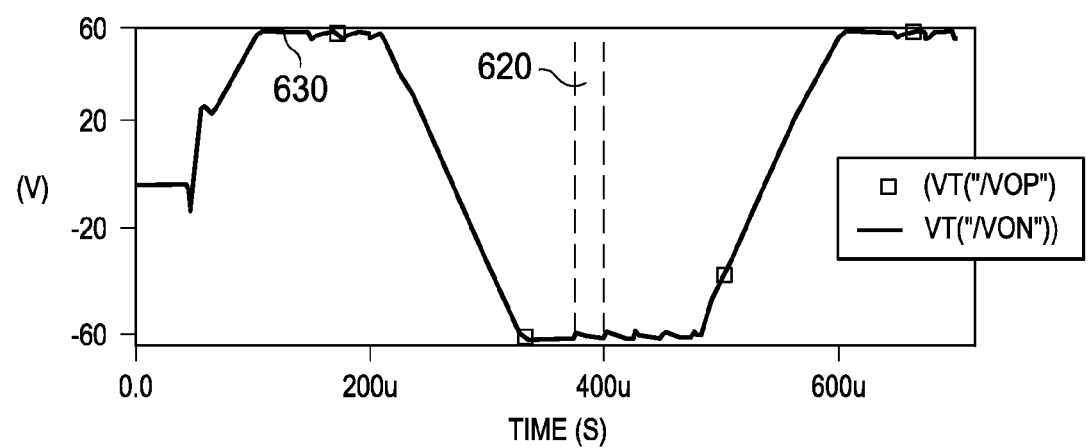
FIG. 6C is a signal diagram of an output voltage of the circuit of FIG. 3.

In FIGS. 6A, 6B, and 6C, the effect of bit stuffing signal 620 is provided. The charging and discharging of the bootstrap capacitor is shown in signal 610. The output pulse width signal is provided in FIG. 6B. FIG. 6C demonstrates the effect on output 630 due to bit stuffing signal 620. FIG. 6A provides a graph of the voltage on the boot-strap capacitor in an example embodiment, showing that there is a ripple on the bootstrap voltage while bit stuffing. However, the bootstrap voltage remains above 9.5 volts in this embodiment, which is enough to drive the high side FET. FIG. 6B provides a graph of the actual output with the bit stuffing pulses inserted. FIG. 6C provides the filtered output which has a small ripple, but goes substantially to the rail voltage. This voltage in 6C is what may be applied to a speaker in a class D amplifier application.

Figure 7:
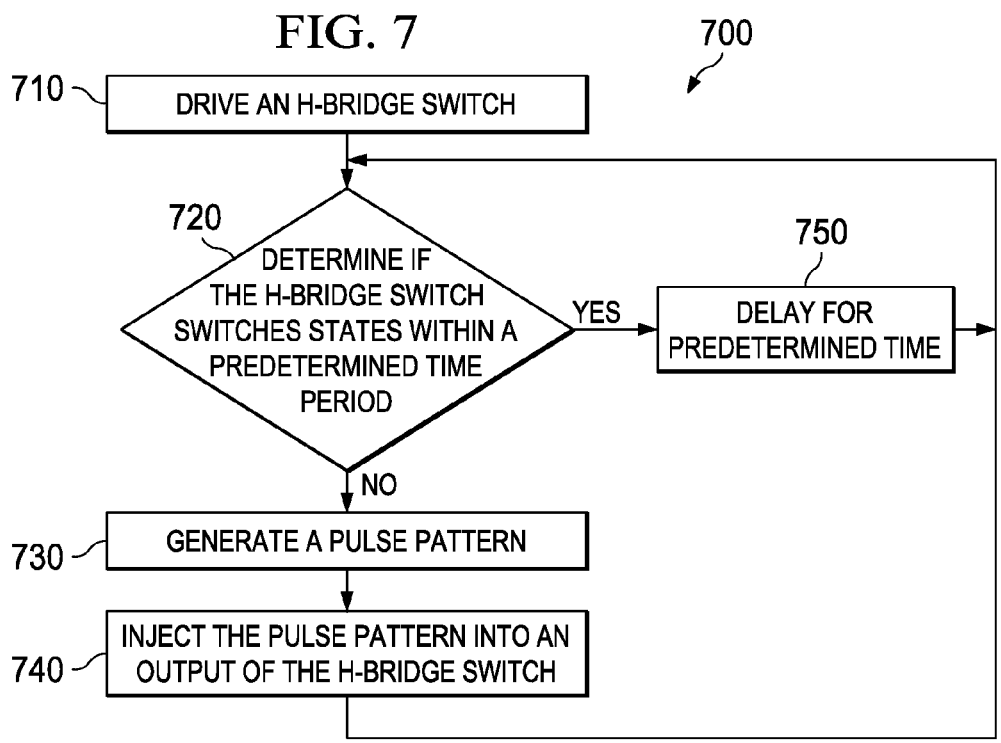
FIG. 7 is a flow diagram of a method of bit stuffing pulse width modulation using the circuit of FIG. 3.

FIG. 7 provides a flow chart for an example embodiment of method 700 of bit stuffing pulse width modulation. In block 710, an h-bridge switch is driven by a gate driver, for example. In block 720, a determination is made as to whether the h-bridge switch switches states within a predetermined time period. If the h-bridge switches within a predetermined time period, in block 750, the signal is delayed for a time period and the determination in block 720 is made again. If, in block 720, the switch does not switch states within the predetermined time period, a pulse pattern is generated. In block 740, the pulse pattern is injected into an output of the h-bridge switch. The method then returns to block 720.

The flow chart of FIG. 7 shows the architecture, functionality, and operation of a possible implementation of bit stuffing PWM software. In this regard, each block may represent a module, segment, or portion of code, which comprises one or more executable instructions for implementing the specified logical function(s). It should also be noted that in some alternative implementations, the functions noted in the blocks may occur out of the order noted in FIG. 7. For example, two blocks shown in succession in FIG. 7 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Therefore, at least the following is claimed:

1. A power supply controller comprising:
a pulse width modulator (PWM) driver couplable to at least a half bridge converter for driving first and second NMOS transistors coupled between an upper and a lower voltage rail and having an output therebetween;
a booster circuit couplable to the output and the upper voltage rail for providing a voltage higher than the upper voltage rail to drive the first NMOS transistor; and
a pulse generator configured to generate a pulse to be injected into the output if a duty cycle of the converter exceeds a predetermined value, wherein a capacitor in the booster circuit will retain a predetermined minimum charge.

2. The power supply controller of claim 1, the controller further comprising a bootstrap circuit configured to generate a bootstrap voltage, the bootstrap voltage greater than the positive supply voltage.

3. The power supply controller of claim 1, wherein the pulse generator comprises:
a timer configured to generate a pulse pattern; and
a counter configured to trigger the timer.

4. The power supply controller of claim 3, wherein the counter is configured to set the period of the pulse pattern.

5. The power supply controller of claim 3, wherein the timer has a configurable delay, the delay configured to set an on-time of the pulse pattern.

6. The power supply controller of claim 3, further comprising logic configured to detect an edge of an output of the H-bridge switch.

7. The power supply controller of claim 6, wherein the logic is configured to detect the edge during a predetermined time period.

8. The power supply controller of claim 7, wherein the predetermined time period is configured by configuring the timer and the counter.

9. A method comprising:
driving an H-bridge switch having a booster circuit for providing an increased voltage to drive a gate of a high side switching transistor;
determining whether the H-bridge switch switches states within a predetermined time period; and
if the H-bridge switch fails to switch, injecting a pulse pattern into an output of the H-bridge switch to cause a capacitor in the booster circuit to be recharged.

10. The method of claim 9, further comprising generating the pulse pattern with a timer.

11. The method of claim 9, wherein determining whether the H-bridge switches states comprises:
sampling the output of the H-bridge switch;
processing the sampled output with an edge detector;
delaying for the predetermined time period; and
resampling the output.

12. A power supply comprising:
an H-bridge switch having a booster circuit for providing an increased voltage to drive a gate of a high side switching transistor; and
a controller comprising:
a pulse width modulator (PWM) driver configured to drive an H-bridge switch; and
a pulse generator configured to generate a pulse, the pulse injected into an output of the H-bridge switch at a minimum duty cycle to cause a capacitor in the booster circuit to be recharged.

13. The power supply of claim 12, wherein the H-bridge switch comprises NMOS devices configured between a positive and negative voltage supply, the booster circuit comprising a bootstrap circuit configured to generate a bootstrap voltage, the bootstrap voltage greater than the positive supply voltage.

14. The power supply of claim 12, wherein the pulse generator comprises:
a timer configured to generate a pulse pattern; and
a counter configured to trigger the timer.

15. The power supply of claim 14, wherein the counter is configured to set the period of the pulse pattern.

16. The power supply of claim 14, wherein the timer has a configurable delay, the delay configured to set an on-time of the pulse pattern.

17. The power supply of claim 14, further comprising logic configured to detect an edge of an output of the H-bridge switch.

18. The power supply of claim 17, wherein the logic is configured to detect the edge during a predetermined time period.

19. The power supply of claim 18, wherein the predetermined time period is configured by configuring the timer and the counter.

* * * * *